United States Patent [19]

Flügge

[11] 4,093,930
[45] June 6, 1978

[54] RADIO TUNING ARRANGEMENT

[75] Inventor: Manfred Flügge, Nuremberg, Germany

[73] Assignee: Grundig E. M. V. Elektro-Mechanische Versuchsanstalt Max Grundig, Germany

[21] Appl. No.: 772,519

[22] Filed: Feb. 28, 1977

[30] Foreign Application Priority Data

Mar. 16, 1975 Germany .......................... 7608023[U]

[51] Int. Cl.² ................................................ H03J 1/02
[52] U.S. Cl. ................................. 334/86; 116/124.1 R
[58] Field of Search ................................. 334/86, 87; 116/124.1 R, 124.4; 325/455

[56] References Cited

U.S. PATENT DOCUMENTS

| | | | |
|---|---|---|---|
| 1,879,294 | 9/1932 | Jones et al. | 116/124.1 R |
| 2,137,684 | 11/1938 | Gillard | 116/124.1 R |
| 2,295,387 | 9/1942 | Creager | 116/124.1 R |

FOREIGN PATENT DOCUMENTS 383,954   11/1932   United Kingdom .................. 334/86

*Primary Examiner*—Paul L. Gensler

[57] ABSTRACT

A radio tuning arrangement is provided wherein a drive cable for rotating a tuning capacitor drum in response to rotation of a tuning knob also serves to provide current to a lamp that moves with an indicator in response to rotation of the knob. The cable includes a pair of conductors that extend longitudinally off the drum to terminal posts through a clamp thereby defining a torsion section of the cable. The conductors also extend circumferentially off the drum to the indicator lamp from opposite sides of a closed path.

5 Claims, 3 Drawing Figures

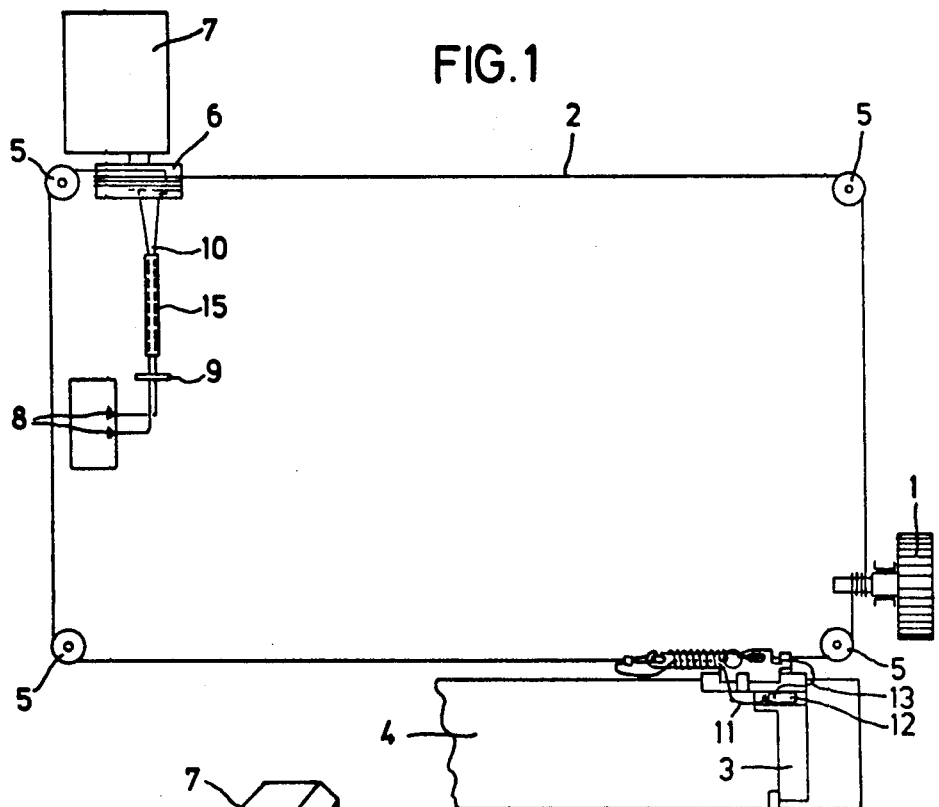
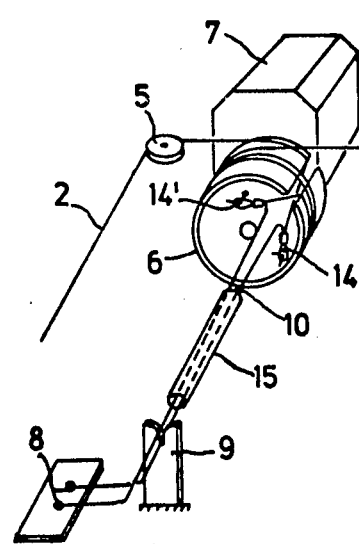
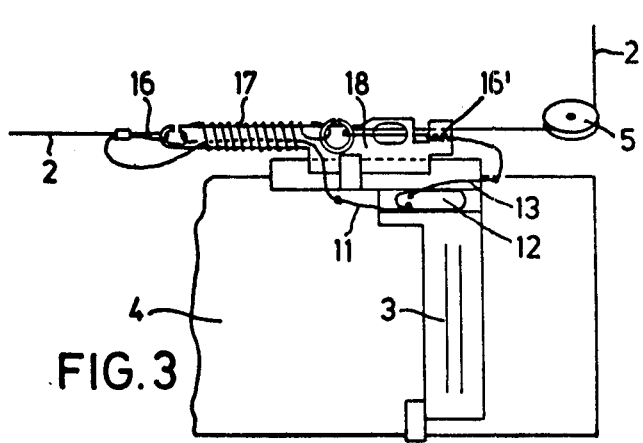
FIG. 1
FIG. 2
FIG. 3

RADIO TUNING ARRANGEMENT

BACKGROUND OF THE INVENTION

The present invention relates to radio tuners and more particularly to an arrangement for providing current to a lamp of the tuner indicator.

In a common type of radio tuner, an indicator is moved along a linear scale by means of a cable which responds to rotation of a tuning control knob. Attempts have also been made heretofore to mount a lamp to the indicator so that the position of the indicator on the scale will be readily illuminated. In such prior art devices, the electrical connection to the lamp has generally been made by a special cord which follows the motion of the lamp. The principal disadvantage of this arrangement is that the possibility exists that the cord can bind on some portion of the radio housing and hence impede tuning or possibly snap. In addition, the constant flexing and unflexing of the cord can result in the cord breaking at solder or crimp joints.

In order to overcome the shortcomings of the arrangements described above, attempts were made to provide current to the lamp through the indicator drive cable with the lamp also making electrical contact with a return rail mounted adjacent the scale. Various modifications in this design were also proposed such as the use of two rails adjacent the scale, however, all these designs require that a sliding electrical contact be made to insure a closed path to the lamp regardless of the specific position of the indicator at any particular time. Thus, these prior art devices required at least one and, in some cases, two sliding electrical contacts. The disadvantage of these arrangements is that the sliding contact represents a source of high frequency noise in the output of the radio. Further, the design of such devices is relatively complicated.

In view of the above, it is the principal object of the present invention to provide an improved arrangement for providing current to a radio tuner indicator lamp which overcomes the objections of the prior art.

A further object is to provide such an arrangement which is relatively simple and inexpensive to incorporate into a tuner.

SUMMARY OF THE INVENTION

The above and other beneficial objects and advantages are attained in accordance with the present invention by providing a radio tuner arrangement wherein current to the indicator lamp is provided through a two-part indicator drive cable. The drive cable extends in a closed path between a drum of the tuner circuit variable condenser, the tuner control knob, and the sliding indicator. The cable has sections wound about the drum and knob and includes a pair of insulated conductors each having a first end extending off the drum longitudinally and affixed to terminal posts which, in turn, are connected to a power supply. An opposite end of the conductors is connected to the lamp after extending off the drum circumferentially to approach the indicator from opposite sides of the closed path. A first loop is formed in each of the conductors and the first loop is hooked to the drum with the conductors extending beyond the first loop to the first end. Clamp means are positioned between the terminal posts and drum to secure the conductors firmly. The cable thus defines a torsion section between the first loops and the clamp means to, in effect, absorb rotation of the drum without causing any twisting in the portion of the drive cable extending to the indicator. A second loop is formed in each of the cables near the opposite ends. The second loops are hooked about portions of the indicator with the conductors extending beyond the second loops for connection with the lamps.

BRIEF DESCRIPTION OF THE DRAWINGS

In the accompanying drawings:

FIG. 1 is a top plan view of the tuning arrangement in accordance with the present invention which, for simplification, has omitted all the components of the radio other than those comprising portions of the tuning arrangement;

FIG. 2 is a perspective view of the portion of tuning arrangement containing the cable torsion section and cable drum; and, FIG. 3 is a perspective view of the portion of the tuning arrangement containing the indicator and lamp.

DETAILED DESCRIPTION OF THE PREFERRED EMBODIMENT

Reference is now made to the drawings and to FIG. 1 in particular wherein a tuning arrangement for a radio receiver in accordance with the present invention is depicted. As is common in many radios now available, tuning for the radio is attained through a tuning knob 1 which has wound about its shaft an indicator drive cable 2 which serves to move an indicator 3 along tuning scale 4. To this end, the indicator drive cable 2 is directed by several guide rollers 5 the position of which depends on the design of the chassis of the radio with which the tuning arrangement is to be used. Suffice it to say, the guides are such as to direct the cable 2 about a cable drum 6 which, in turn, is connected to a shaft extending from a variable tuning capacitor 7. The guide rollers 5 serve to direct the cable in a closed path from the tuning knob 1, about the cable drum 6, to the indicator 3 so that rotation of the knob serves the double purpose of varying the useful area of the plates of capacitor 7 and moving the indicator 3 to a position along the scale indicating the frequency to which the capacitor has been tuned.

As shown in FIG. 2, the indicator drive cable 2 consists of two conductors each of which terminates at one end at a terminal post 8 which, in turn, is connected to a power supply (not shown). It will be noted that one end of both conductors extends longitudinally off the cable drum 6 to a clamp 9 and thence each of the conductors extends beyond the clamp for connection to a terminal post 8 which, in turn, is connected to the power supply. The cable is wound about drum 6 with one of the conductors extending along one leg of the closed cable path to one terminal 11 of indicator lamp 12 and the other conductor extends through the other leg of the closed path to terminal 13 of indicator lamp 12. That is, one of the conductors extends to the lamp 12 via the knob 1 while the other conductor extends to the lamp from the other side of the cable path.

Referring still to FIG. 2, it can be seen that a pair of loops 14 and 14' are provided in the conductors of the drive cable with the loops connected to the end of the drum 6. The cable extends longitudinally off the end of the drum to clamp 9 wherein it is held fast so that the portion of the cable between clamp 9 and the terminal post 8 does not react to rotation of drum 6. The portion of the cable between clamp 9 and the end of drum 6 defines a torsion section. That is, a section of the cable which twists in response to rotation of the drum. A plastic tube 15 encases the torsion section and it has been noted that the tube insures that twisting of the conductors will occur evenly. It should thus be noted that as drum 6 rotates in response to rotation of the tuning knob 1, the torsion section 10 of the cable will twist but remaining sections of the cable will not.

Referring to FIG. 3, it can be shown that the opposite ends of the conductor 2 are led to the lamp 12 mounted to indicator 3. To this end, cable loops 16 and 16' are provided at the opposite ends of cable 2 with a hook connected to one end of a tension spring 17 which, in turn, is connected to the indicator slide. Spring 17 serves to equalize the tension throughout cable 2. A cable clamp or holder 18 is provided to receive the loop 16' formed in the other conductor.

The cable conductors are, of course, encased in a suitable insulator with the insulation removed for contact with terminals 8, 11 and 13.

Thus, in accordance with the above, the aforementioned objects are effectively attained.

Having thus described the invention, what is claimed is:

1. A radio tuner arrangement for use with a radio of the type wherein tuning is accomplished by the rotation of a knob which, in turn, rotates a variable condenser drum via a cable, said arrangement comprising: a tuning scale; an indicator disposed for movement along said scale; a lamp mounted to said indicator for movement therewith; a drive cable extending in a closed path between said drum, knob and indicator, said drive cable having sections thereof wound about said drum and knob, said drive cable further including a pair of insulated conductors each having a first end extending off said drum longitudinally and affixed to a terminal post and an opposite end connected to said lamp, said conductors extending off said drum circumferentially to said indicator from opposite sides of said path; said conductors being fixed to an end of said drum and extending beyond said drum end to clamp means positioned between said terminal post and drum whereby to define a torsion section in said cable between said drum end and said clamp means.

2. The invention in accordance with claim 1 wherein a first loop is formed in each of said conductors, said first loop is hooked to said drum end and said conductors extend beyond said first loops to said terminal post.

3. The invention in accordance with claim 2 further comprising a second loop formed in each of said conductors and said second loops are hooked about portions of said indicator with said conductors extending beyond said second loops to said lamp.

4. The invention in accordance with claim 1 further comprising a tube disposed about the torsion section of said cable.

5. The invention in accordance with claim 2 further comprising guide means disposed in said closed path on opposite sides of said indicator and said indicator includes a tension spring having a free end receiving one of said conductor second loops.

* * * * *